(12) United States Patent
Thompson et al.

(10) Patent No.: US 6,545,561 B2
(45) Date of Patent: Apr. 8, 2003

(54) METHOD TO FIND A VALUE WITHIN A RANGE USING WEIGHTED SUBRANGES

(75) Inventors: William N. Thompson, Meridian, ID (US); John D. Porter, Meridian, ID (US); Larren Gene Weber, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/929,571

(22) Filed: Aug. 14, 2001

(65) Prior Publication Data

US 2002/0017965 A1 Feb. 14, 2002

Related U.S. Application Data

(62) Division of application No. 09/382,525, filed on Aug. 25, 1999, now Pat. No. 6,275,119.

(51) Int. Cl.⁷ .......................... H03H 11/30; H03H 11/28
(52) U.S. Cl. ........................................ 333/17.3; 333/32
(58) Field of Search ................... 333/17.3, 32; 375/36, 375/257; 455/123, 125, 129, 289; 379/340, 398, 402, 403, 404, 394

(56) References Cited

U.S. PATENT DOCUMENTS

| | | | |
|---|---|---|---|
| 3,805,028 A | 4/1974 | Morton | 382/133 |
| 5,095,231 A | 3/1992 | Sartori et al. | 326/30 |
| 5,134,311 A | 7/1992 | Biber et al. | 327/108 |
| 5,296,756 A | 3/1994 | Patel et al. | 326/21 |
| 5,459,440 A | * 10/1995 | Claridge et al. | 333/17.3 |
| 5,606,275 A | 2/1997 | Farhang et al. | 327/108 |
| 5,666,078 A | 9/1997 | Lamphier et al. | 327/108 |

* cited by examiner

Primary Examiner—Benny Lee
Assistant Examiner—Stephen E. Jones
(74) Attorney, Agent, or Firm—Schwegman, Lundberg, Woessner & Kluth, P.A.

(57) ABSTRACT

A method of finding an unknown value from within a range of values is disclosed that divides the range into weighted subranges and then, beginning with an arbitrary search value within the range, performs a number of simple comparisons to determine the value for each subrange that will result in a match with the target value. This method can also detect those cases where the target value lies outside the range. In one embodiment, the method of finding an unknown value within a range of values is applied to impedance matching. In this embodiment, the output impedance of a pin on an integrated circuit is automatically matched to the impedance of the load connected to it. The output driver has a controllable impedance that can be adjusted within a specific range of impedances to match the external load impedance it is to drive.

24 Claims, 6 Drawing Sheets

METHOD TO FIND A VALUE WITHIN A RANGE USING WEIGHTED SUBRANGES

CROSS REFERENCE TO RELATED APPLICATION(S)

This application is a division of U.S. patent application Ser. No. 09/382,525, now U.S. Pat. No. 6,275,119 filed on Aug. 25, 1999, the specification of which is incorporated herein by reference.

FIELD OF THE INVENTION

This invention relates to the field of information processing, and more particularly, to the matching of values in information systems.

BACKGROUND OF THE INVENTION

Information processing applications must often find a value within a range of values. For example, a sorting system may organize discrete units of information into groups defined by numerical boundaries. Before assigning each discrete unit of information to a group, the relationship between each discrete unit of information and the numerical boundaries must be established. Defining these relationships often requires finding a value within a range of values. In some sorting systems, this is accomplished using a compute intensive sort algorithm in combination with a high performance microprocessor. Unfortunately, high performance microprocessors are expensive, and therefore not suitable for use in products directed to the consumer market.

An analog-to-digital (A/D) converter generates digital output information related to analog input information. The conversion process associated with one type of A/D converter requires manipulating discrete pieces of information, the on and off states of resistor ladder switches, in such a way that the final configuration of resistor ladder switches matches a value within a range of values. Modem A/D converters are designed to operate on a single chip and to function in a variety of end user applications, such as cellular telephones and video games. A single A/D converter design may be required to function in an application that requires eight, twelve, sixteen or more bits of resolution. Designers attempt to provide this flexibility in an A/D converter by providing an on chip microprocessor. Unfortunately, the supplied microprocessor often has a limited instruction set, and operates at a low frequency, so the requirements for applications that must operate at both high frequency and high resolution, such as quickly matching a two byte value within a range of values, are difficult to meet.

Some control systems seek to drive a difference signal, which is the difference between an output information signal and an-input signal, to zero in order to maintain a constant relationship between the input signal and the output information signal. This process of driving the difference signal to zero may require the identification of a value within a range of values.

In modern digital control systems, the control function is often performed by a microprocessor. In some systems designed primarily for high reliability, such as systems designed for use in satellites, high function may also be required. High function microprocessors tend to fail more often than low function microprocessors, so it is difficult to meet both requirements, and often a low function microprocessor is selected for a particular application. Unfortunately, the same algorithms and software that accomplish tasks on a high function microprocessor, such as identifying a value within a range of values, do not work on low function microprocessors.

For these and other reasons there is a need for the present invention.

SUMMARY OF THE INVENTION

The above-mentioned problems and other problems are addressed by the present invention and will be understood by one skilled in the art upon reading and studying the following specification. A method of finding an unknown value from within a range of values is disclosed that divides the range into weighted subranges and then, beginning with an arbitrary search value within the range, performs a number of simple comparisons to determine the value for each subrange that will result in a match with the target value. This method can also detect those cases where the target value lies outside the range.

In one embodiment, the method of finding an unknown value within a range of values is applied to impedance matching. In this embodiment, the output impedance of a pin on an integrated circuit is automatically matched to the impedance of the load connected to it. The output driver has a controllable impedance that can be adjusted within a specific range of impedances to match the external load impedance it is to drive.

DETAILED DESCRIPTION OF THE INVENTION

In the following detailed description of the invention, reference is made to the accompanying drawings which form a part hereof, and in which are shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. The following detailed description is not to be taken in a limiting sense, and the scope of the present invention is defined only by the appended claims.

General Algorithm Description

A method of finding an unknown value from within a range of values operates by dividing the range into weighted subranges. Beginning with an arbitrary search value within the range, the method performs a number of simple comparisons to determine the value for each subrange that will result in a match with the target value. This method can also detect those cases where the target value lies outside the range.

The first general step of the method is to define the allowable range and the subranges that will be used. The subranges are defined such that higher order subranges represent some multiple of the next lower order subrange. An example would be the use of the place order of digits in a number to define the subranges for ones, tens, hundreds, etc. In this example the ones subrange is the lowest order subrange and offers the finest resolution. Each higher order subrange is a multiple of the subrange that precedes it, offering a reduction in resolution as a trade off for a larger step size for use in searching for the target value. With the subranges defined, the unknown target becomes a reference to compare the search value against.

Depending on the results of an initial comparison, the search branches to either of two paths to determine the correct value for the highest order subrange needing adjustment in order to achieve a match condition. Upon successful completion of either path, a lower order subrange will be marked as the new highest order subrange for subsequent comparisons and the search continues by branching to the other path. The search alternates between the two paths until the lowest order subrange has been adjusted and a match has been achieved.

In the first path, the search value is greater than or not less than the target value. Beginning with the lowest order subrange, the subrange is set to its minimum value and the resulting new search value is compared against the target value. This process is repeated with each higher order subrange until a) the highest subrange is reached or b) the search value is no longer greater than the target value. If the search value is still greater than the target value when the highest order subrange is reached, then the highest order subrange is decremented until the search value is no longer greater than the target value or until the highest order subrange reaches its minimum value, whichever occurs first. In either case, the highest order subrange has been set to its correct value. If the search value becomes less than or no longer greater than the target value, the next lower subrange is marked as the new highest order subrange for subsequent comparisons and the search branches to a second path. If the search value becomes less than or no longer greater than the target value before the highest order subrange is reached, then all of the higher order subranges have been already set to their correct value. The subrange whose change caused the search value to no longer be greater than the target value is marked as the new highest order subrange and the search branches to the second path. If all subranges become set to their minimum values and the search value is still greater than the target value then an underflow condition has been detected and the search is ended.

In the second path, the search value is less than or not greater than the target value. Beginning with the lowest order subrange, set the subrange to its maximum value and compare the resulting new search value against the target. This process is repeated with each higher order subrange until a) the highest order subrange is reached or b) the search value is greater than or no longer less than the target value. If the search value is still less than the target value when the highest order subrange is reached, then the highest order subrange is incremented until either the search value is no longer less than the target value or the highest order subrange reaches its maximum value. Either of these stopping conditions is a result of the highest order subrange being set to its correct value. If the search value is no longer less than the target value, the next lower order subrange is marked as the new highest order subrange and the search branches to the first path. If the search value becomes greater than or not less than the target value before the highest order subrange is reached, then the subrange whose change caused this condition is marked as the new highest order subrange and the search branches to the first path. If all subranges become set to their maximum value and the search value is still less than the target value, then an overflow condition has been detected and the search is ended.

One embodiment of the algorithm 100 can generally be described with reference to FIG. 1. Initialization occurs at 102 where the lowest order subrange index LOS is set equal to zero and the number of subranges N is selected. The highest order subrange index HOS is set equal to N−1, or one less than the number of subranges, in 104. The search index i is set equal to the lowest order subrange index LOS at 106.

A search value is compared to a target value at 108. If the search value is greater than the target value, then the search proceeds along a first search path by comparing the search index i to the highest order subrange index HOS at 130. If the search index i is not equal to the highest order subrange index HOS, then the value of the subrange indexed by i is set to its minimum value and the search index i is incremented at 132. The new search value resulting from the operation at 132 is then compared to the target value at 134, and if the search value is greater than the target value then the comparison at 130 is performed again. The search will continue in this loop until the search index i is equal to the highest order subrange index HOS at 130 or until the search value is not greater than the target value at 134. If the search value is not greater than the target value at 134, then the control flows to 116 where the highest order subrange index HOS is set equal to the search index.

If the search index i is equal to the highest order subrange index HOS at 130, then all the lower order subranges have been set to their minimum values and it is necessary to decrease the value of the highest order subrange until the search value is not greater than the target value. The search continues at 138 by comparing the value of subrange indexed by the search index i to its minimum value. If the value of the subrange is not equal to its minimum value, then the value of the subrange is decremented at 140. The new search value resulting from the operation at 140 is compared to the target value at 142. If the search value is not greater than the target value at 142, then the control flows back to the comparison at 138. If the search value is not greater than the target value at 142 then the correct value for the subrange indexed by the highest order subrange index HOS has been found and the control flows to 126.

If the subrange indexed by the search value i is equal to its minimum value at 138 then an underflow condition has been detected and the control flows to 144. This underflow results from the following conditions being met: 1) the highest order subrange being compared at 138 equals its minimum value, 2) the lower order subranges all equal their minimum values, 3) the search value is greater than the target value. Since the first two of these three conditions indicate that the search value is set to its minimum value, it is not possible to decrease the search value further to make it match the target value. From this point control flows to 148.

Returning focus to the original comparison at 108, if the search value is not greater than the target value, then the search proceeds along a second search path by comparing the search index i to the highest order subrange index HOS at 110. If the search index i is not equal to the highest order subrange index HOS, then the value of the subrange indexed by i is set to its maximum value and the search index i is incremented at 112. The new search value resulting from the operation at 112 is then compared to the target value at 114, and if the search value is not greater than the target value then the comparison at 110 is performed again. The search will continue in this loop until the search index i is equal to the highest order subrange index HOS at 110 or until the search value is greater than the target value at 114. If the search value is greater than the target value at 114, then the control flows to 116 where the highest order subrange index HOS is set equal to the search index i.

If the search index i is equal to the highest order subrange index HOS at 110, then all the lower order subranges have been set to their maximum values and it is necessary to increase the value of the highest order subrange until the search value is greater than the target value. The search continues at 118 by comparing the value of the subrange indexed by the search index i to its maximum value. If the value of the subrange is not equal to its maximum value, then the value of the subrange is incremented at 120. The new search value resulting from the operation at 120 is compared to the target value at 122. If the search value is not greater than the target value at 122, then the control flows back to the comparison at 118. If the search value is greater than the target value at 122 then the correct value for the subrange indexed by the highest order subrange index HOS has been found and the control flows to 126.

If the subrange indexed by the search value i is equal to its maximum value at 118 then an overflow condition has been detected and the search control flows to 124. This overflow results from the following conditions being met: 1) the highest order subrange being compared at 118 equals its maximum value, 2) the lower order subranges all equal their maximum values, 3) the search value is not greater than the target value. Since the first two of these three conditions indicate that the search value is set to its maximum value, it is not possible to increase the search value further to make it match the target value. From this point control flows to 148.

In the comparison at 126, if the highest order subrange HOS and the lowest order subrange index LOS are equal, then all the subranges have been set to the values that cause the search value to match the target value. From here the control flows to 148. If the highest order subrange index HOS does not equal the lowest order subrange index LOS at 126, then it is necessary to continue the search to find the correct setting for at least one lower order subrange. The control flows to 128 where the search index i is decremented and the highest order subrange index HOS is set equal to this new value of i, indexing the next lower subrange.

Setting the highest order subrange index HOS to a new value, either at 116 or at 128, marks the successful completion of the current search path control flows to 106 where the search index i is set equal to the lowest order subrange index LOS. Following this the search value is compared to the target value at 108. At the successful completion of the first path, the search value will not be greater than the target value so the control flows to the second path at 110. Likewise, at the completion of the second path, the search value will be greater than the target value so the control flows to the first path at 130. Thus the search alternates between the two search paths until a solution is obtained.

Once a solution has been found, or an underflow or overflow condition has been detected, control flows to 148. At this point the results of the search are stored and control flows to 104 in preparation for a new search to begin.

The embodiment described above has several advantages. First, it rapidly converges to the target value. Second, the individual operations map easily into the instruction set of inexpensive microprocessors, which makes this an attractive method of identifying a target value in a range of values in inexpensive consumer products.

Figure 1:
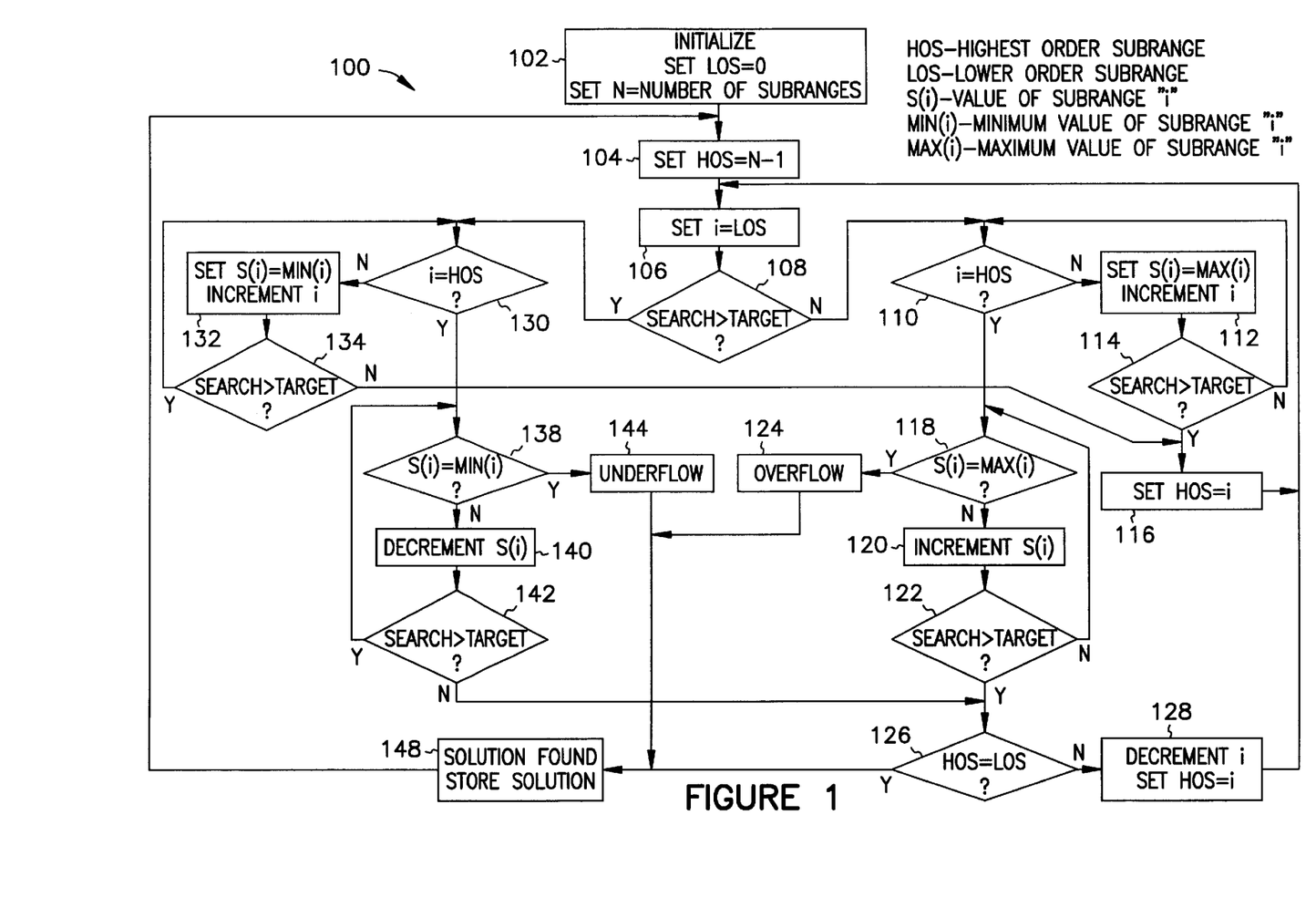
FIG. 1 is a flowchart of the general operation of the method of finding a value within range using weighted subranges.

The dynamic operation of one embodiment of a system embodying the method of FIG. 1 and described above is best understood by studying Tables 1–4 that follow.

Tables 1–4 show in detail the progress through a system embodying the method illustrated in the flowchart of FIG. 1 for specific search and target values. For example, in Table 1, the initial search value is 4961 and the initial target value is 0375, and as can be seen in the beginning search value column the search starts with 4961 and ends with 375, which is the last entry in the ending search value column. Similarly, for Table 2, the initial search value is 1756 and the target value is 2104, for Table 3, the initial search value is 4961 and the target value is 375, and for Table 4, the initial search value is 1756 and the target value is 5104. References to path #1 refer to the "yes" branch out of decision block 108, and references to path #2 refer to the "no" branch out of decision block 108.

TABLE 1

Lowest Order Subrange (LOS)--- ONES
2nd LOS (LOS + 1)--- TENS
3rd LOS (LOS + 2)--- HUNDREDS
Highest Order Subrange (HOS)--- THOUSANDS
EXAMPLE #1 Initial Search Value > Target Value Search Range: 0000–9999
Initial Search Value: 4961
Target Value: 0375

| Beginning Search Value | Ending Search Value | Comments |
|---|---|---|
|  |  | Search > Target, branch to path #1 |
| 4961 | 4960 | LOS set to min. |
| 4960 | 4900 | LOS + 1 set to min. |
| 4900 | 4000 | LOS + 2 set to min. |
| 4000 | 3000 | Dec HOS |
| 3000 | 2000 | Dec HOS |
| 2000 | 1000 | Dec HOS |
| 1000 | 0000 | Dec HOS |
|  |  | Search < Target, HOS found, LOS + 2 becomes new HOS, branch to path #2 |
| 0000 | 0009 | LOS set to max. |
| 0009 | 0099 | LOS + 1 set to max. |
| 0099 | 0199 | Inc LOS + 2 |
| 0199 | 0299 | Inc LOS + 2 |
| 0299 | 0399 | Inc LOS + 2 |
|  |  | Search > Target, LOS + 2 found, LOS + 1 becomes new HOS, branch to path #1 |
| 0399 | 0390 | LOS set to min. |
| 0390 | 0380 | Dec LOS + 1 |
| 0380 | 0370 | Dec LOS + 1 |

TABLE 1-continued

| | | |
|---|---|---|
| | | Search < Target, LOS + 1 found, LOS becomes new HOS, branch to path #2 |
| 0370 | 0371 | Inc LOS |
| 0371 | 0372 | Inc LOS |
| 0372 | 0373 | Inc LOS |
| 0373 | 0374 | Inc LOS |
| 0374 | 0375 | Inc LOS |
| | | Search = Target, end. |

TABLE 2

| | |
|---|---|
| Lowest Order Subrange (LOS)--- | ONES |
| 2nd LOS (LOS + 1)--- | TENS |
| 3rd LOS (LOS + 2)--- | HUNDREDS |
| Highest Order Subrange (HOS)--- | THOUSANDS |
| EXAMPLE #2 Initial Search Value < Target Value | |
| Search Range: | 0000–9999 |
| Initial Search Value: | 1756 |
| Target Value: | 2104 |

| Beginning Search Value | Ending Search Value | Comments |
|---|---|---|
| | | Search < Target, branch to path #2 |
| 1756 | 1759 | LOS set to max. |
| 1759 | 1799 | LOS + 1 set to max. |
| 1799 | 1999 | LOS + 2 set to max. |
| 1999 | 2999 | Inc HOS |
| | | Search > Target, HOS found, LOS + 1 becomes new HOS, branch to path #1 |
| 2999 | 2990 | LOS set to min. |
| 2990 | 2900 | LOS + 1 set to min. |
| 2900 | 2800 | Dec LOS + 2 |
| 2900 | 2700 | Dec LOS + 2 |
| 2900 | 2600 | Dec LOS + 2 |
| 2900 | 2500 | Dec LOS + 2 |
| 2900 | 2400 | Dec LOS + 2 |
| 2900 | 2300 | Dec LOS + 2 |
| 2900 | 2200 | Dec LOS + 2 |
| 2900 | 2100 | Dec LOS + 2 |
| | | Search < Target, LOS + 2 found, LOS + 1 becomes new HOS, branch to path #2 |
| 2100 | 2109 | LOS set to max. |
| | | Search > Target, LOS + 1 found, LOS becomes new HOS, branch to path #1 |
| 2109 | 2108 | Dec LOS |
| 2108 | 2107 | Dec LOS |
| 2107 | 2106 | Dec LOS |
| 2106 | 2105 | Dec LOS |
| 2105 | 2104 | Dec LOS |
| | | Search = Target, end. |

TABLE 3

| | |
|---|---|
| Lowest Order Subrange (LOS)--- | ONES |
| 2nd LOS (LOS + 1)--- | TENS |
| 3rd LOS (LOS + 2)--- | HUNDREDS |
| Highest Order Subrange (HOS)--- | THOUSANDS |
| EXAMPLE #3 Target Value < Min Range Value | |
| Search Range: | 1000–4999 |
| Initial Search Value: | 4961 |
| Target Value: | 0375 |

| Beginning Search Value | Ending Search Value | Comments |
|---|---|---|
| | | Search > Target, branch to path #1 |
| 4961 | 4960 | LOS set to min. |
| 4960 | 4900 | LOS + 1 set to min. |
| 4900 | 4000 | LOS + 2 set to min. |
| 4000 | 3000 | Dec HOS |
| 3000 | 2000 | Dec HOS |
| 2000 | 1000 | Dec HOS |
| | | Search at bottom of range. |
| | | Search > Target, UNDERFLOW, end. |

TABLE 4

| | |
|---|---|
| Lowest Order Subrange (LOS)--- | ONES |
| 2nd LOS (LOS + 1)--- | TENS |
| 3rd LOS (LOS + 2)--- | HUNDREDS |
| Highest Order Subrange (HOS)--- | THOUSANDS |
| EXAMPLE #4 Target Value > Max Range Value | |
| Search Range: | 1000–4999 |
| Initial Search Value: | 1756 |
| Target Value: | 5104 |

| Beginning Search Value | Ending Search Value | Comments |
|---|---|---|
| | | Search < Target, branch to path #2 |
| 1756 | 1759 | LOS set to max. |
| 1759 | 1799 | LOS + 1 set to max. |
| 1799 | 1999 | LOS + 2 set to max. |
| 1999 | 2999 | Inc HOS |
| 2999 | 3999 | Inc HOS |
| 3999 | 4999 | Inc HOS |
| | | Search at top of range. |
| | | Search < Target, OVERFLOW, end. |

One Embodiment of the General Algorithm to Impedance Matching

The present invention has practical applications in many types of electronic systems. In one application, the present invention may be embodied in memory devices such as static random access memories (SRAM's), as part of a memory package such as single in line memory modules (SIMM's) or dual in line memory modules (DIMM's). As additional SIMM's or DIMM's are added to motherboards of computer systems, the characteristic impedance of the memory bus may change. The present invention allows for the adaptation to changes in the impedance on a memory bus when new memory is added to or removed from the bus by dynamically matching the bus driver impedance with the resulting bus impedance.

Figure 1A:
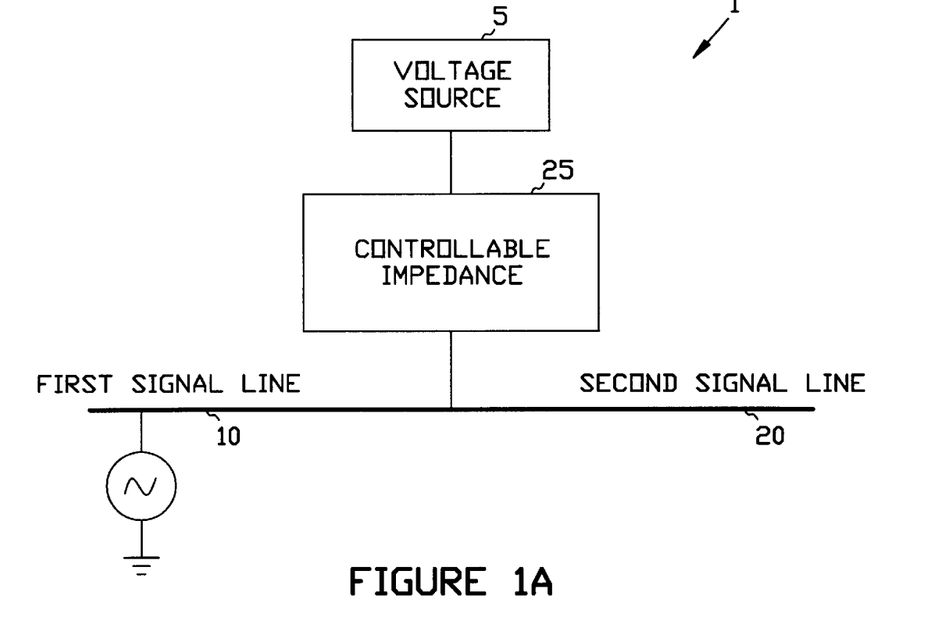
FIG. 1A is a block diagram of one embodiment of an impedance matching system including a controllable impedance.

Referring to FIG. 1A, impedance matching system 1, in one embodiment of the present invention, comprises voltage source 5, first signal line 10, second signal line 20, and controllable impedance 25. First signal line 10 is connected to second signal line 20, and controllable impedance 25 is connected between voltage source 5 and first signal line 10 and second signal line 20.

Signal line 10 and signal line 20 are transmission devices capable of carrying electronic signals. For example, signal line 10 and signal line 20 can be signal carrying lines in an integrated circuit or a memory device, a conductive wire, a wiring pattern on a system board, a strip line, or a coaxial cable. In addition, signal line 10 and signal line 20 need not be the same type of transmission device, nor need they exist in the same electronic subsystem. For example, signal line 10 can be a signal carrying line in an integrated circuit, while signal line 20 can be a coaxial cable connected to the signal carrying line in the integrated circuit.

Figure 2A:
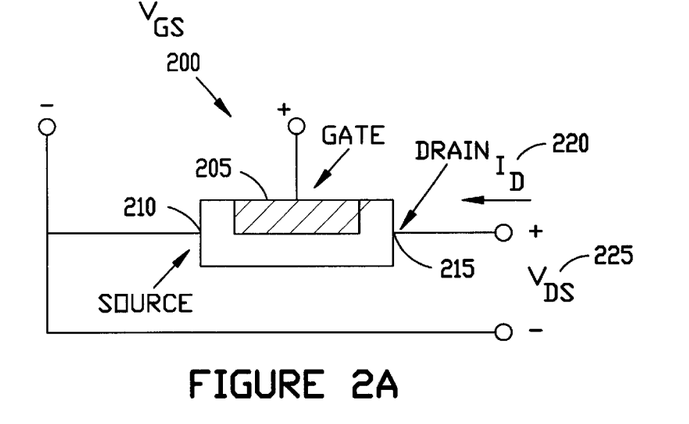
FIG. 2A is a diagram of a metal-oxide-semiconductor field-effect transistor (MOSFET) suitable for use in connection with one embodiment of the present invention.
Figure 2B:
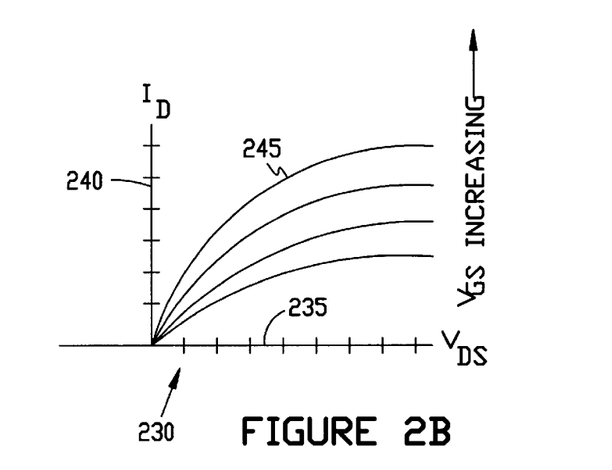
FIG. 2B is a graph of the drain-to-source conductance of a MOSFET suitable for use as a variable impedance in one embodiment of the present invention.
Figure 2C:
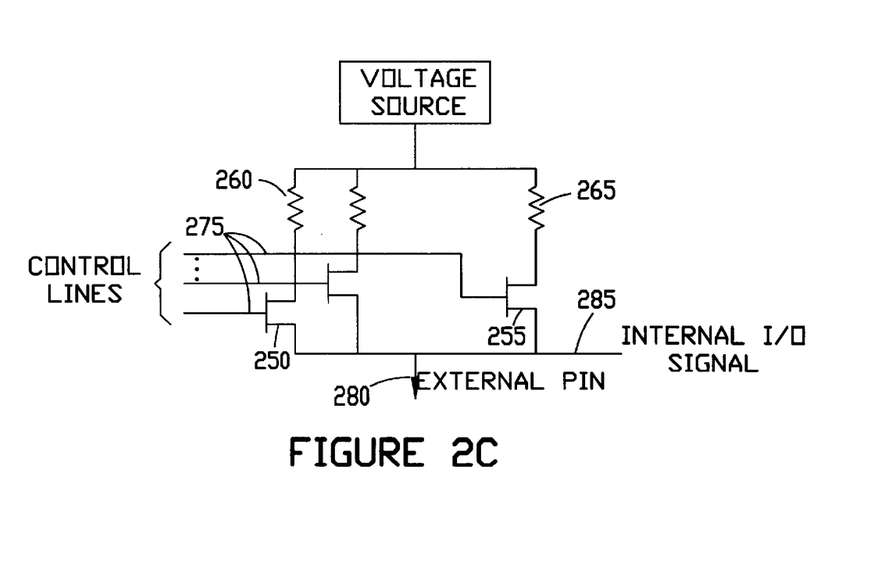
FIG. 2C is a schematic diagram of a parallel connection of serially connected resistor-transistor pairs suitable for use in connection with one embodiment of the present invention.

Controllable impedance 25 is an electronic device having an impedance or a resistance that can be controlled. In one embodiment, controllable impedance 25 comprises a plurality of parallel resistor-transistor pairs. The parallel resistor-transistor pairs define a resistance ladder, and by switching on a transistor in one of the resistor-transistor pairs, a resistor is added to the resistance ladder. After the first resistor is added to the ladder, adding additional resistors to the resistor ladder by turning on a transistor decreases the resistance of the controllable impedance. A parallel arrangement of resistor-transistor pairs is shown in FIG. 2C and is described in more detail below.

In an alternate embodiment, controllable impedance 25 comprises a transistor that has a controllable impedance or resistance. For example, a metal-oxide semiconductor (MOSFET) transistor is an electronic device that has a resistance that can be controlled.

Voltage source 5 can be selected to provide an appropriate value for controllable impedance 25. If controllable impedance 25 requires a positive voltage source to operate, then a positive voltage is selected for voltage source 5. If controllable impedance 25 requires a negative voltage source to operate, then a negative voltage is selected for voltage source 5. In addition voltage source 5 can be powered from a source of voltage, which is often referred to as a system voltage and designated as $V_{CC}$ or $V_{DD}$.

Impedance matching system 1 ensures that information signals originating on signal line 10 are not reflected back along signal line 10 as they are transmitted to signal line 20. Controllable impedance 25 is dynamically changed to match the impedance of signal line 10 to the impedance of signal line 20. This dynamic matching eliminates reflections at the point where signal line 10 is connected to signal line 20.

An Alternate Embodiment of the General Algorithm to Impedance Matching

Figure 1B:
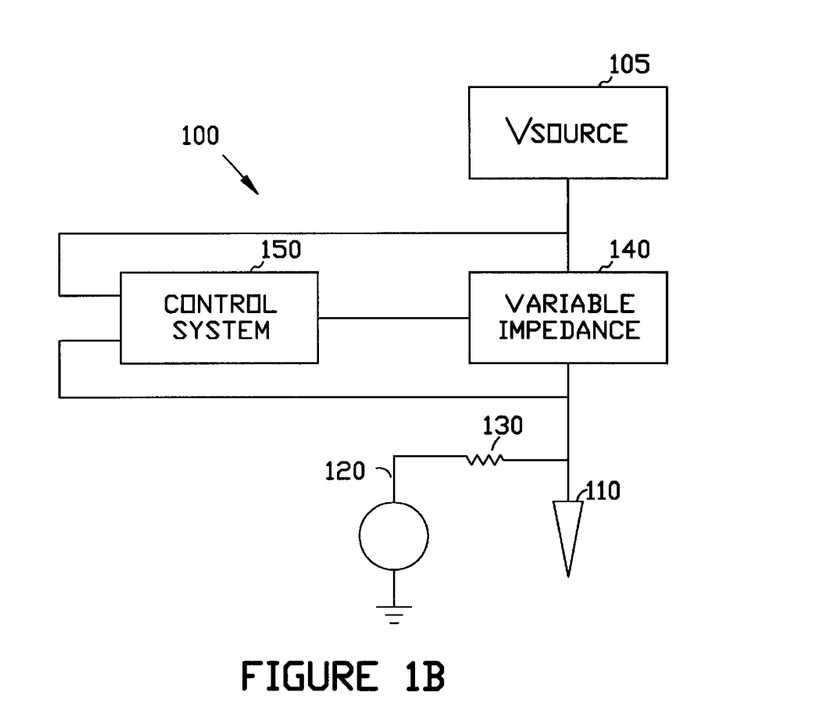
FIG. 1B is a block diagram of one embodiment of an impedance matching system including a variable impedance and a control system.

Referring to FIG. 1B, impedance matching system 100, in one embodiment of the present invention, comprises $V_{SOURCE}$ voltage 105, external pin 110 having a pin voltage and a pin circuit impedance, and signal source 120 having signal source impedance 130, variable impedance 140, and control system 150 having a first input port, a second input port and an output port. Variable impedance 140 couples $V_{SOURCE}$ voltage 105 to the external pin 110. The first input port of control system 150 is coupled to $V_{SOURCE}$ voltage 105, the second input port of control system 150 is coupled to external pin 110, and the output signal of control system 150 is coupled to variable impedance 140. Signal source 120 is also coupled to external pin 110. External pin 110 may be an input pin, an output pin, or a bidirectional input-output (I/O) pin, which is suitable for use with a tristate device.

Variable impedance 140, in one embodiment of the present invention, is a metal-oxide semiconductor field-effect transistor (MOSFET), which is controlled by the control system 150 to adjust the impedance on input-output (I/O) pin 110. Both n-type and p-type metal-oxide semiconductor field-effect transistors are suitable for use in connection with the present invention, and can be configured with an appropriate voltage source, either positive or negative. FIGS. 2A and 2B show a diagram of a MOSFET suitable for use in the present invention and a family of MOSFET curves showing drain current versus drain-to-source voltage for various gate-to-source voltages. Those skilled in the art will recognize that the voltage between the gate and source terminals of a MOSFET can be used to control the impedance between the drain and source terminals. For example, referring to FIG. 2A, MOSFET 200 comprises gate terminal 205, source terminal 210, drain terminal 215, drain current, $I_D$ 220, and drain-to-source voltage, $V_{DS}$ 225, and a voltage between gate terminal 205 and source terminal 210 can control the impedance between drain terminal 215 and source terminal 210.

The relationship between the drain-to-source voltage, $V_{DS}$ 225, and the drain current, $I_D$ 220, of FIG. 2A, is shown in FIG. 2B. Graph 230 in FIG. 2B comprises x-axis 235, y-axis 240, and a family of conductance curves 245. X-axis 235 represents the drain-to-source voltage, $V_{DS}$ 225, and y-axis 240 represents the drain current, $I_D$ 220, for MOSFET 200 of FIG. 2A. A family of conductance curves 245 shows the drain current, $I_D$ 220, versus the drain-to-source voltage, $V_{DS}$ 225, for MOSFET 200 of FIG. 2A having a range of gate-to-source voltages. Those skilled in the art will recognize that for MOSFET 200 of FIG. 2A, the slope of each of the conductance curves in the family of conductance curves 245 of FIG. 2B, can be varied by varying the gate-to-source voltage, and thereby changing the conductance between the drain and source terminals of MOSFET 200. Using a MOSFET as a variable impedance permits a broad range of impedance values to be easily obtained.

Variable impedance 140, in an alternate embodiment of the present invention, is a parallel arrangement of serially connected resistor-transistor pairs coupling $V_{SOURCE}$ voltage 105 to external pin 110. Those skilled in the art will recognize that the resistance of the parallel arrangement of the serially connected resistor-transistor pairs is controlled by switching each transistor on or off in order to either include the resistor in the circuit or exclude the resistor from the circuit.

Referring to FIG. 2C, a parallel arrangement of a plurality of serially connected resistor-transistor pairs comprising transistor 250, transistor 255, resistor 260, and resistor 265 is shown. Also shown are control lines 275, external pin 280, and internal input/output (I/O) signal 285. The transistor selected for use in each resistor-transistor pair is not critical to the practice of the invention. Any transistor capable of functioning as a switch is suitable for use in practicing the invention. The resistor value for each resistor-transistor pair is selected based on the impedances of the signal source in the system. If the impedance of the signal source varies over a wide range of values, then a weighted set of resistor values is preferred. If the impedance of the signal source varies over a narrow range of values, then a set of resistors having the same value is preferred.

Referring again to FIG. 1B, an advantage of using a parallel arrangement of serially connected resistor-transistor pairs is that the impedance between the $V_{SOURCE}$ voltage 105 and the external pin 110 is capable of being digitally controlled, and a digitally controlled variable impedance 140 is easily coupled to control system 150. Another advantage of using a parallel arrangement of serially connected resistor-transistor pairs is that variable impedance 140 can be implemented in a variety of semiconductor technologies, since the transistor is only required to function as a switch.

An Embodiment of a Control System for Use with the General Algorithm

Figure 3:
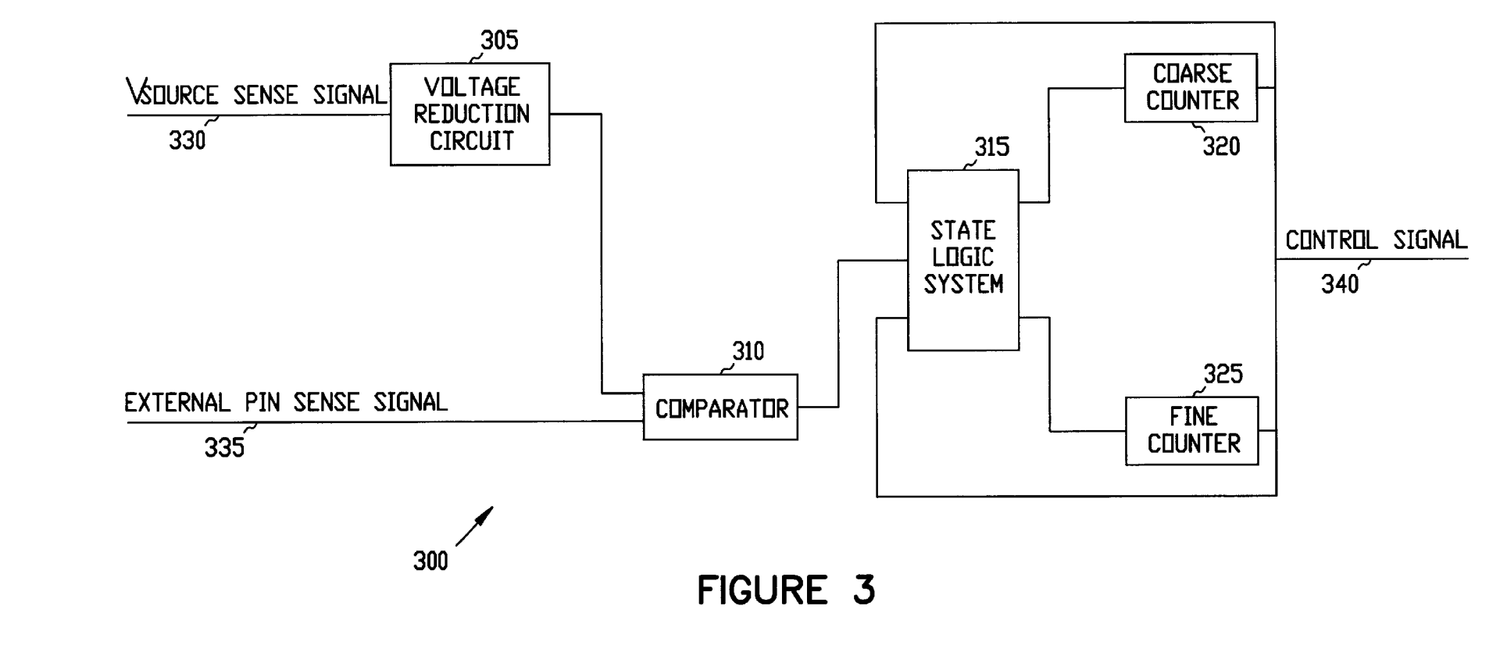
FIG. 3 is a block diagram of a control system for use in connection with one embodiment of the present invention.
Figure 4A:
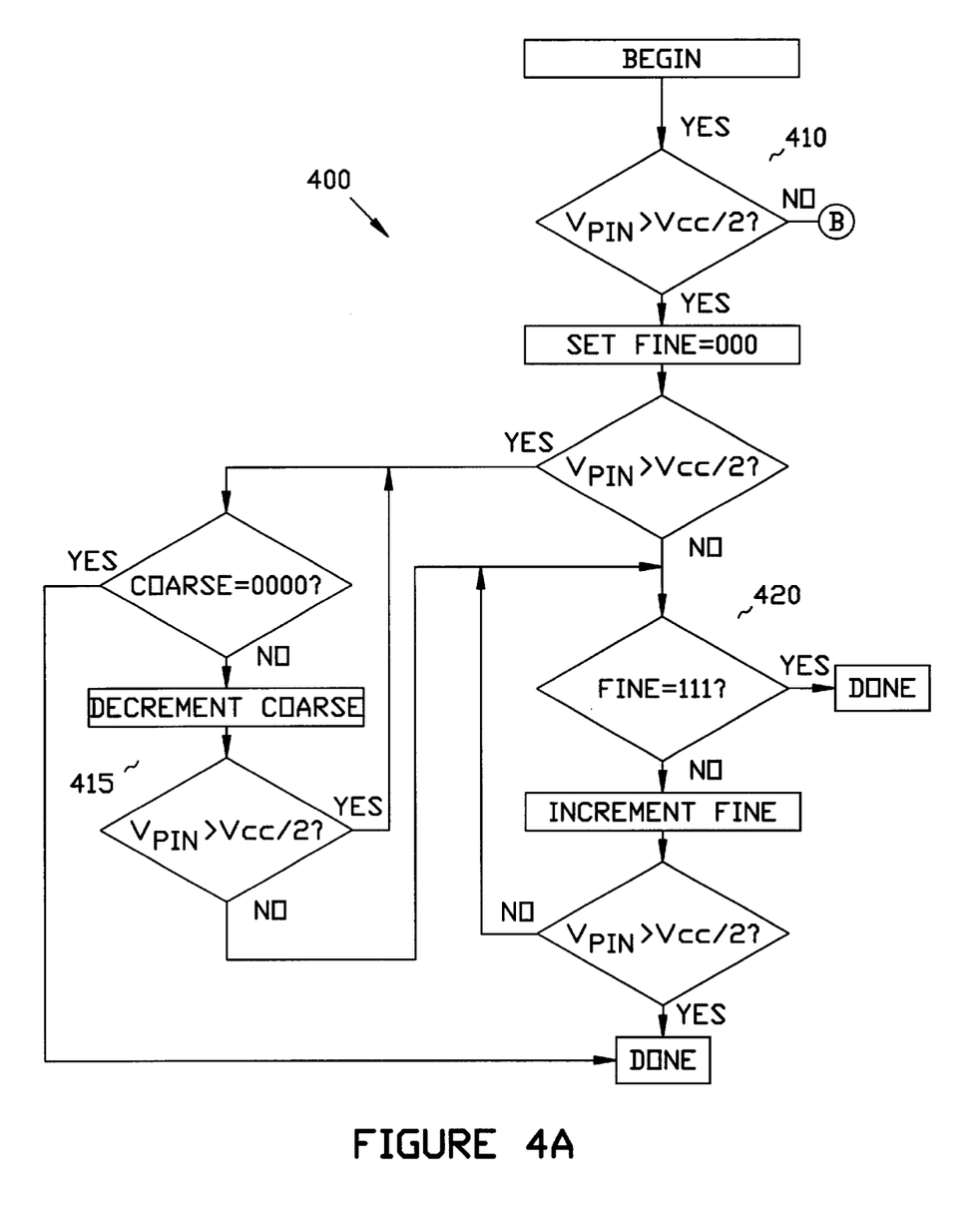
FIG. 4A is part one of a flow chart of one embodiment of an impedance matching method.
Figure 4B:
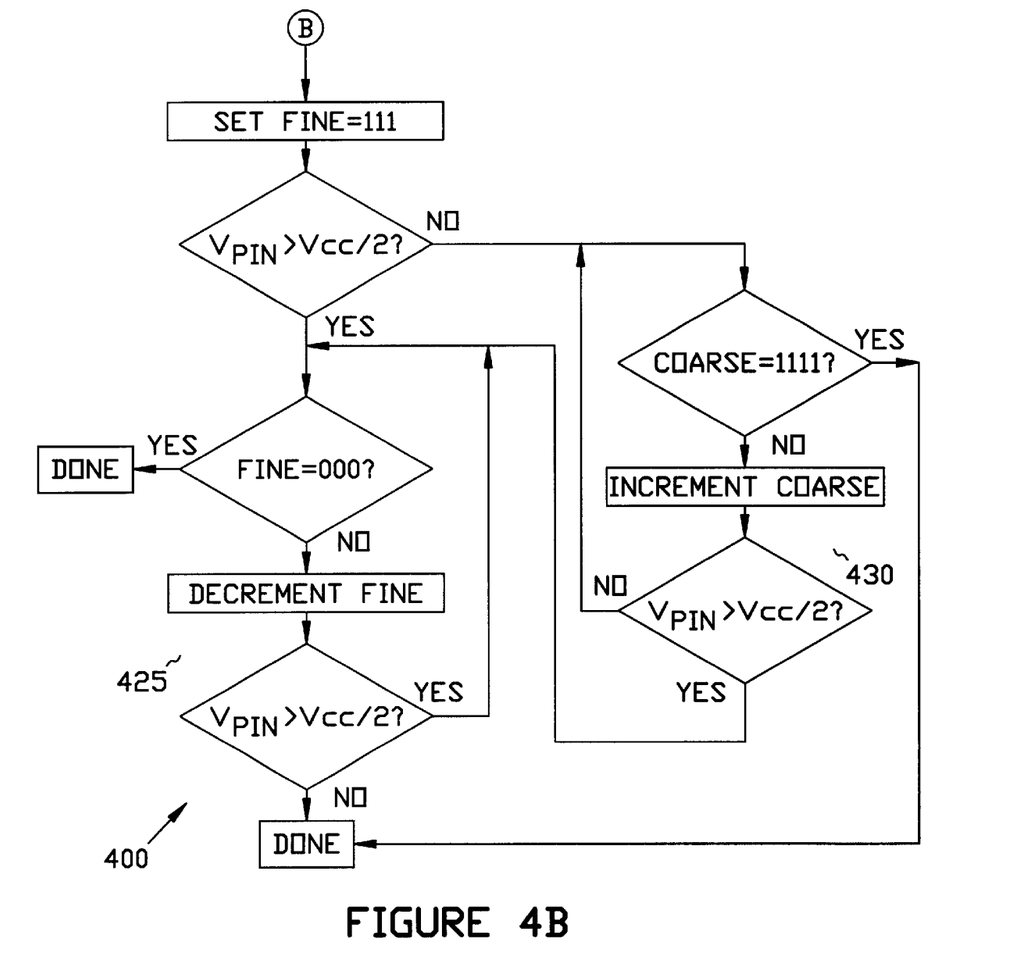
FIG. 4B is part two of a flow chart of one embodiment of an impedance matching method.

FIG. 3 shows a block diagram of one embodiment of a control system 300 suitable for use in the present invention. Control system 300 comprises voltage reduction circuit 305, comparator 310, state logic system 315, coarse counter 320, and fine counter 325. Voltage reduction circuit 305 receives $V_{SOURCE}$ sense signal 330, which carries the voltage $V_{SOURCE}$ 105 of FIG. 1B. Comparator 310 receives an output signal from voltage reduction circuit 305 and external pin sense signal 335, which carries the voltage present at external pin 110 of FIG. 1B. State logic system 315 receives an output signal from comparator 310, an output signal from coarse counter 320 and an output signal from fine counter 325. Coarse counter 320 and fine counter 325 receive output signals from state logic system 315. The output signals of coarse counter 320 and fine counter 325 are combined to create control signal 340, which can be used to increment or decrement the value of variable impedance 140 of FIG. 1B. An embodiment of an algorithm that defines the operation state logic system 315, coarse counter 320, and fine counter 325 is shown in FIG. 4A and FIG. 4B.

Referring again to FIG. 1B, in operation control system 150 is capable of sensing $V_{SOURCE}$ voltage 105 and the pin voltage at external pin 110 and of driving variable impedance 140 to a value that maintains the pin voltage at external pin 110 at a value equal to one-half the value of $V_{SOURCE}$ voltage 105. When control system 150 achieves this result, the pin circuit impedance at external pin 110 matches signal source impedance 130.

Referring again to FIG. 3, in operation state logic system 315 generates count up and count down signals that are coupled to the input port of coarse counter 320 and the input port of fine counter 325 in order to generate control signal 340, which, when connected to variable impedance 140 of FIG. 1B is capable of increasing and decreasing variable impedance 140 of FIG. 1B. State logic system 315 responds to the outputs of coarse counter 320, fine counter 325, and the output of comparator 310 to count up or count down coarse counter 320 and to count up or count down fine counter 325. In one embodiment, comparator 310 generates an output signal that indicates to state logic system 315 whether the output signal from voltage reduction circuit 305 is greater than or less than external pin sense signal 345. The speed of comparator 310 is not critical to the practice of the present invention. Voltage reduction circuit 305, which in one embodiment can be a non-inverting amplifier, scales $V_{SOURCE}$ sense signal 330 by a factor of one-half. The output signal of voltage reduction circuit 305 is coupled to an input port of comparator 310.

Those skilled in the art will recognize that, in another embodiment of the present invention, a microprocessor can be substituted for state logic system 315, coarse counter 320, and fine counter 325. The flow diagram of FIG. 4A and FIG. 4B defines the operation of state logic system 315 in combination with coarse counter 320 and fine counter 325. This flow diagram can be reduced to a computer program, which can be executed on a microprocessor. Since the flow diagram is composed of a small number of simple comparisons and assignments arranged in tight loops, a microprocessor having small instruction set is suitable for use in the present invention.

An Embodiment of the General Algorithm Using Counters

Referring to FIG. 4A and FIG. 4B, in one embodiment of the present invention, an impedance matching algorithm 400 defines the logical operation of state logic system 315, coarse counter 320, and fine counter 325 of FIG. 3 or a microprocessor.

The operation of the flow diagram of FIG. 4A and FIG. 4B is best understood by assuming values for the external pin voltage of FIG. 1B, $V_{PIN}$, and the voltage source of FIG. 1B, $V_{SOURCE}$ 105, which is designated as $V_{CC}$, in FIG. 4A and FIG. 4B, and tracing a path through the flow diagram. Impedance matching algorithm 400 shown in FIG. 4A and FIG. 4B begins at decision block 410.

At decision block 410, $V_{PIN}$ is compared to $V_{CC}/2$. If the pin voltage is greater than $V_{CC}/2$, then fine counter 325 is set to zero. If $V_{PIN}$ is not greater than $V_{CC}/2$, then fine counter 325 is set to its maximum value.

Assuming that $V_{PIN}$ is greater than $V_{CC}/2$, the algorithm is prepared to consider executing branch 415 and branch 420. For $V_{PIN}$ greater than $V_{CC}/2$, the strategy of the algorithm in branch 415 and branch 420 is to decrement coarse counter 320 until $V_{PIN}$ is less than $V_{CC}/2$, and to then increment fine counter 325 until $V_{PIN}$ equals $V_{CC}/2$. When $V_{PIN}$ equals $V_{CC}/2$, the pin circuit impedance matches the signal source impedance. However, if after zeroing fine counter 325, $V_{PIN}$ is not greater than $V_{CC}/2$, then coarse counter 320 need not be adjusted and only fine counter 325 is adjusted, incremented until it reaches its maximum value or until $V_{PIN}$ equals $V_{CC}/2$.

Assuming that $V_{PIN}$ is not greater than $V_{CC}/2$, the algorithm is prepared to consider executing branch 425 and branch 430. For $V_{PIN}$ not greater than $V_{CC}/2$, the strategy of the algorithm in branch 425 and branch 430 is to increment coarse counter 320 until $V_{PIN}$ is greater than $V_{CC}/2$ and to then decrement fine counter 325 until $V_{PIN}$ equals $V_{CC}/2$. When $V_{PIN}$ equals $V_{CC}/2$, the pin circuit impedance matches the signal source impedance. However, if after setting fine counter 325 to all ones, $V_{PIN}$ is greater than $V_{CC}/2$, then coarse counter 320 need not be adjusted and only fine counter 325 is adjusted, decremented until it reaches its minimum value or until $V_{PIN}$ equals $V_{CC}/2$.

Conclusion

The present invention has practical applications in many types of electronic systems. In one application, the present invention may be embodied in memory devices such as static random access memories (SRAM's), as part of a memory package such as single in line memory modules (SIMM's) or dual in line memory modules (DIMM's). As additional SIMM's or DIMM's are added to motherboards of computer systems, the characteristic impedance of the memory bus may change. The present invention allows for the adaptation to changes in the characteristic impedance on a memory bus when new memory is added to or removed from the bus by dynamically matching the bus driver impedance with the resulting bus impedance.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method comprising:
   sensing a source voltage and a pin circuit voltage at an external pin; and
   continuously controlling a variable impedance, connected to the source voltage and the external pin, in response to the source voltage and the pin circuit voltage to maintain the pin circuit voltage at one-half the source voltage, wherein the variable impedance comprises a parallel arrangement of serially-connected resistor-transistor pairs defining a resistance ladder, wherein continuously controlling the variable impedance comprises switching a transistor in one of the resistor-transistor pairs on to include its respective resistor and switching the transistor in one of the resistor-transistor pairs off to exclude the respective resistor.

2. The method of claim 1, wherein sensing a source voltage and a pin circuit voltage at an external pin comprises:

sensing the source voltage with a voltage reduction circuit; and sensing the pin circuit voltage with a comparator.

3. The method of claim 1, wherein continuously controlling a variable impedance, connected to the source voltage and the external pin, in response to the source voltage and the pin circuit voltage to maintain the pin circuit voltage at one-half the source voltage comprises:

receiving a digital comparison signal; and digitally generating a control signal for continuously controlling the variable impedance.

4. The method of claim 1, wherein the external pin comprises an input pin.

5. The method of claim 1, wherein the external pin comprises an output pin.

6. The method of claim 1, wherein the external pin comprises a bidirectional input-output pin.

7. A method comprising:

comparing a pin circuit voltage at an external pin to one-half of a source voltage to generate a comparison signal; and continuously controlling a variable impedance, connected to the source voltage and the external pin, in response to the comparison signal to maintain the pin circuit voltage at one-half the source voltage, wherein the variable impedance comprises a parallel arrangement of serially-connected resistor-transistor pairs defining a resistance ladder, wherein continuously controlling the variable impedance comprises switching a transistor in one of the resistor-transistor pairs on to include its respective resistor and switching the transistor in one of the resistor-transistor pairs off to exclude the respective resistor.

8. The method of claim 7, wherein continuously controlling a variable impedance, connected to the source voltage and the external pin, in response to the comparison signal to maintain the pin circuit voltage at one-half the source voltage comprises:

receiving a digital comparison signal; and digitally generating a control signal for continuously controlling the variable impedance.

9. The method of claim 7, wherein the transistor comprises a metal-oxide semiconductor field-effect transistor.

10. A method comprising:

sensing a source voltage;

generating a voltage signal that is one-half the source voltage;

comparing a pin circuit voltage signal to the voltage signal to generate a comparison signal;

adjusting a coarse counter having an output signal in response to the comparison signal;

adjusting a fine counter having an output signal in response to the comparison signal; and controlling a variable impedance with the output signal of the coarse counter and the output signal of the fine counter to drive the pin circuit voltage signal to the generated voltage signal, wherein controlling the variable impedance comprises switching a transistor in a resistor-transistor pair on to include its respective resistor and switching the transistor in the resistor-transistor pair off to exclude the respective resistor.

11. A method comprising:

sensing a source voltage;

generating a voltage signal that is one-half the source voltage;

comparing a pin circuit voltage signal to the voltage signal to generate a comparison signal;

adjusting a coarse counter variable having a value in response to the comparison signal;

adjusting a fine counter variable having a value in response to the comparison signal; and controlling a variable impedance with the value of the coarse counter variable and the value of the fine counter variable to drive the pin circuit voltage signal to the generated voltage signal, wherein controlling the variable impedance comprises switching a transistor in a resistor-transistor pair on to include its respective resistor and switching the transistor in the resistor-transistor pair off to exclude the respective resistor.

12. The method of claim 11, wherein the resistor-transistor pair is one of a plurality of resistor-transistor pairs.

13. The method of claim 12, wherein plurality of resistor-transistor pairs are serially connected to form a resistance ladder.

14. The method of claim 11, wherein when the pin circuit voltage signal reaches the generated voltage signal, a pin circuit impedance matches a signal source impedance.

15. The method of claim 11, wherein the transistor comprises a MOSFET having a gate terminal, a drain terminal, and a source terminal.

16. A method, comprising:

sensing a source voltage and a pin circuit voltage at an external pin; and continuously controlling a variable impedance, connected to the source voltage and the external pin, in response to the source voltage and the pin circuit voltage to maintain the pin circuit voltage at one-half the source voltage, and to maintain a pin circuit impedance at the external pin equal to a signal source impedance, wherein continuously controlling the variable impedance comprises switching a transistor in a resistor-transistor pair on to include its respective resistor and switching the transistor in the resistor-transistor pair off to exclude the respective resistor.

17. The method of claim 16, wherein continuously controlling the variable impedance further comprises:

incrementing a coarse counter to a value greater than one-half of the source voltage, when the pin circuit voltage is initially less than one-half of the source voltage.

18. The method of claim 17, further comprising:

decrementing a fine counter until the value of the coarse counter and the fine counter equals one-half of the source voltage when the pin circuit voltage is initially less than one-half of the source voltage.

19. The method of claim 18, further comprising:

decrementing the coarse counter to a value less than the pin circuit voltage, when the pin circuit voltage is initially greater than one-half of the source voltage.

20. The method of claim 19, further comprising:

incrementing the fine counter until the value of the coarse counter and the fine counter equals one-half of the source voltage, when the pin circuit voltage is initially greater than one-half of the source voltage.

21. A method, comprising:

comparing a pin circuit voltage at an external pin to one-half of a source voltage to generate a comparison signal; and continuously controlling a variable impedance, connected to the source voltage and the external pin, in response to the comparison signal to maintain the pin circuit voltage at one-half the source voltage, wherein the variable impedance comprises a parallel arrangement of serially connected resistor-transistor pairs, and wherein controlling the variable impedance further comprises switching a transistor in one of the resistor-transistor pairs on to include its respective resistor and switching the transistor in one of the resistor-transistor pairs off to exclude the respective resistor.

22. A method, comprising:

sensing a source voltage;

generating a voltage signal that is one-half the source voltage;

comparing a pin circuit voltage signal to the voltage signal to generate a comparison signal;

adjusting a coarse counter having an output signal in response to the comparison signal;

adjusting a fine counter having an output signal in response to the comparison signal; and controlling a variable impedance with the output signal of the coarse counter and the output signal of the fine counter to drive the pin circuit voltage signal to the generated voltage signal, wherein controlling the variable impedance comprises switching a transistor in a resistor-transistor pair on to include its respective resistor and switching the transistor in the resistor-transistor pair off to exclude the respective resistor wherein the transistor comprises a MOSFET having a gate terminal, a drain terminal, and a source terminal.

23. The method of claim 22, wherein the sensing further comprises sensing the source voltage at an external pin.

24. The method of claim 23, further comprising:

sensing the pin circuit voltage at the external pin.

* * * * *